United States Patent [19]

Mellul et al.

[11] Patent Number: 5,059,450
[45] Date of Patent: Oct. 22, 1991

[54] PROCESS FOR PRODUCING ELECTRIC CONNECTING MEANS, IN PARTICULAR INTERCONNECTION SUBSTRATES FOR HYBRID CIRCUITS

[75] Inventors: Sylvie Mellul, Vitry-sur-Seine, France; Frederic Rotman, Tokyo, Japan; Dominique Navarro, Pont De La Maye, France

[73] Assignee: L'Air Liquide, Paris, France

[21] Appl. No.: 495,028

[22] Filed: Mar. 16, 1990

[30] Foreign Application Priority Data

Mar. 16, 1989 [FR] France ................................. 8903942

[51] Int. Cl.$^5$ ............................................ C23C 26/00
[52] U.S. Cl. .................................... 427/96; 427/374.1
[58] Field of Search ................................ 427/96, 374.1

[56] References Cited

U.S. PATENT DOCUMENTS

| 4,388,347 | 6/1983 | Shum | 427/96 |
| 4,540,604 | 9/1985 | Siuta | 427/96 |
| 4,622,240 | 11/1986 | Yext | 427/96 |
| 4,627,160 | 12/1986 | Herron | 427/96 |

FOREIGN PATENT DOCUMENTS 0135174 3/1985 European Pat. Off. .
0286690 10/1988 European Pat. Off. .

OTHER PUBLICATIONS

IEEE Transaction on Components, Hybrids, and Manufacturing Tech., vol. ChMT-8, No. 2, Jun. 1985, pp. 253–258, IEEE, N.Y., U.S.; N. Iwase et al.: "Thick film and direct bond copper forming technologies for aluminum nitride substrate".

29th Electronic Components Conference, Cherry Hill, NJ, 14–16 May 1979, pp. 1–10, IEE, N.Y., U.S.; J. D. Mitchell et al.: "Processing Techniques for Fabricating Thick Film Copper/Dielectric Multilayer Structures".

Proceedings of the Electronic Components Conference, Seattle, 1986, pp. 471–480, IEEE, N.Y., U.S; R. J. Bacher et al.: "Firing process–related failure mechanisms in thick film copper multilayers".

Primary Examiner—Shrive Beck
Assistant Examiner—Vi Duong Dang
Attorney, Agent, or Firm—Browdy & Neimark

[57] ABSTRACT

The process comprises, after deposition of a layer of raw ink on a support having a high thermal dissipation, of the aluminium nitride type, effecting a preliminary drying of this ink at a temperature on the order of 100° C. to 150° C., then a firing comprising:

(a) a temperature rise including a polymer resin eliminating stage,
(b) a sintering plateau at a temperature on the order of 600° C. to 1000° C., and
(c) a timed cooling, wherein the atmosphere of the polymer resin eliminating stage has an oxygen content of between 100 ppm and 5000 ppm, while the oxygen contents of the high temperature sintering atmosphere and of the cooling atmosphere must be lower than about 10 ppm.

9 Claims, No Drawings

PROCESS FOR PRODUCING ELECTRIC CONNECTING MEANS, IN PARTICULAR INTERCONNECTION SUBSTRATES FOR HYBRID CIRCUITS

FIELD OF THE INVENTION

The present invention relates to a process for producing electric connection means, in particular interconnection substrates for hybrid circuits, comprising, after deposition of a raw ink layer on a support having a high thermal dissipation of the aluminium nitride type, effecting a preliminary drying of said ink at a temperature on the order of 100° C. to 150° C., then a firing comprising:

a) a rise in temperature incorporating a stage for eliminating polymer resins,
b) a firing plateau at a temperature on the order of 600° C. to 1000° C., and
c) a timed cooling.

BACKGROUND OF THE INVENTION

The "thick layer" technology is in very wide use in microelectronics for manufacturing interconnection substrates of hybrid circuits. These substrates serve as supports and as interconnection elements for the various electronic components constituting the circuit and, for this purpose, they are essentially formed by a mechanical support also performing the function of a thermal dissipator on which conductive, insulating and/or resistive layers are added which realize, with varied patterns, all of the interconnections. The substrate is usually a ceramic and most often 96% pure alumina.

The thick layers are formed with inks or pastes which are essentially constituted by a functional phase, an inorganic binder, and an organic vehicle (solvents and polymer resins which impart a good rheology to the paste).

The functional phase provides the electrical properties of the layer as concerns conductivity, resisitivity or insulation. It is in the form of powders which are metallic for the conductive layers, based on glasses or ceramics for the insulating layers. The inorganic binder has for function to ensure a good adherence between the layer and the support.

In practice, the deposition of a layer of raw ink on the substrate is carried out by serigraphy according to a pattern previously formed on a screen which is a sieve, and the deposit is obtained by the passage of the ink through the meshes of the screen: the drying operation is intended to eliminate the solvents, while the firing of the assembly at high temperature produces, after elimination of the polymer resins, by sintering and/or fusion of the constituents, a film having a thickness of between about 5 microns and about 50 microns which adheres to the surface of the support.

The firing of the layers of ink after drying represents a complex heat treatment operation in the course of which the role of the atmosphere is primary. In particular, the atmosphere provides an environment suitable for a carrying out of the operations for effecting the sintering and the adherence of the layer on the support which is as correct as possible.

In the case of conductive inks based on noble metals such as platinum, gold, palladium or silver, and with respect to the compatible insulating and resistive inks, the firing is carried out under air. The use of an oxidizing atmosphere such as air is quite suitable for the operation eliminating the polymer resins remaining in the layer after drying. The oxygen present in the atmosphere facilitates this elimination of the resins by oxidation of the organic compounds which are vapourized and pyrolized with rise in temperature.

On the other hand, in the case of conductive inks based on a non-noble metal such as copper or other so-called compatible materials, the firing requires an inert atmosphere obtained by the use of neutral gases such as nitrogen, argon, helium, if desired a combination of these gases, so as to avoid the oxidation of the metal.

As concerns these conductive inks based on copper, it is recommended to effect the firing under nitrogen with less than 10 ppm of oxygen present in the atmosphere of the whole of the furnace. There may be cited in this respect as an example the technical notices for the use of copper inks issued by the firm Du Pont de Nemours which recommends effecting the firing of conductive copper pastes in an atmosphere of nitrogen containing between 5 and 10 ppm of oxygen.

In such an atmosphere, notwithstanding the fact that it contains a few ppm of oxygen, the elimination of the polymer resins is often incomplete, above all when large volumes of paste are treated or in the case of the production of multilayers which surround large areas of dielectric. As a result, there is a certain number of deteriorations of the layers and in particular a reduction in their adherence to the substrate. The mechanisms involved in these deteriorations were studied in the case of the deposition of copper inks on alumina, and are in particular described by R. J. Bacher and V. P. Siuta in an article entitled "Firing Process-related Failure Mechanisms in Thick-Film Copper Multilayers" which appeared in "Proc. of the Electronic Components Conference, IEEE," 1986 p 471–480.

One solution proposed concerns the preferential doping of the inert atmosphere of the furnace with oxygen in the region of the zone for eliminating the polymer resins without modifying the oxygen contents of the sintering and cooling zones. The authors of the article showed that the oxygen content, even with the zone for eliminating the polymer resins, must remain limited, in any case lower than 100 ppm, if satisfactory results are to be obtained. As an example, F. Franconville and M. Auray, in an article entitled "Copper displaces gold in production of multilayer substrates for computer application" which appeared in "Proc. of the Third European Hybrid Microelectronics Conference", 1981 p 174–187 proposed conditions of firing copper multilayers on alumina, recommending for the firing of compatible copper dielectric inks the presence of 150 to 300 ppm of oxygen in the zone for eliminating the polymer resins, however, noting that the firing of the copper conductive layers must be effected under nitrogen containing less than 20 ppm of oxygen in all the stages of the firing.

These recommendations therefore imply the use of two different atmospheres, one for the firing of the copper conductive layers and the other for the firing of the compatible copper dielectric layers.

Furthermore, in the aforementioned article by R. J. Bacher and V. P. Siuta, the authors also studied the effects of doping the nitrogen with oxygen in the zone of the elimination of the polymer resins on the properties of copper multilayer circuits obtained in these conditions and reached the conclusion that, for an oxygen content as high as 100 ppm, the hermetic property of the dielectric layers is largely improved. On the other hand, as concerns the copper conductive layers, these authors note a distinct degradation of the solderability of the copper layers in respect of oxygen contents of 100 ppm and higher contents. They indicate correct conditions of solderability for 30 ppm of oxygen in the polymer binder eliminating zone.

Lastly, E. A. Webb, in an article entitled "Effects of Copper Thick-Film Processing on Adhesion and Bondability" which appeared in "Proc. of the 6th European Microelectronics Conference, ISHM", 1987 Bournemouth, England p 128–135, studied the effect of the atmospheric conditions applied during the firing of copper conductive thick layers on the adhesion and solderability of the circuits obtained. This author found an improvement in the adhesion properties in the respect of oxygen contents in the polymer resin eliminating zone ranging from 7 to 15 ppm, whereas beyond 15 ppm of oxygen, the author notes a distinct degradation of the solderability of the copper layer.

The evolution of electronics toward the use of power circuits and/or the production of complex functions requiring a very dense implantation of the components, leads to a much greater dissipation of amounts of heat in the region of the substrate.

This evolution has resulted in a search for new electrically insulating materials possessing a thermal conductivity higher than that of alumina. The properties of beryllium oxide (BeO) make it a possible candidate, but its toxicity, when it is in the form of a powder, reduced its use in practice. On the other hand, aluminium nitride (AlN) possesses comparable electrical and thermal conduction properties but can be handled and machined without danger.

In this context, the copper/aluminium nitride system finally represents a definitely advantageous solution for the high integration of the components and for power microelectronics, in that it combines the exceptional properties of copper (high electrical conductivity, excellent solderability to tin, lead...) and the high thermal conductivity of aluminium nitride.

The difficulty of obtaining quality copper thick layers on alumina was mentioned hereinbefore. The manufacture of thick copper layers on aluminium nitride presents further difficulties owing to the non-oxide character of this ceramic, which appears to be the cause of a low wetability of the aluminium nitride by the metals. In a technical communication ("Material Matters", Vol VII, No 3,) Electro-Science Laboratories presented a comparative study of the initial adhesion and after aging obtained in the case of thick copper layers produced on different sources of alumina and aluminium nitride. The adhesion was followed by the removal of the top layer of the copper studs of 4 sq. mm. Their results show that, with respect to all the tested substrates, the initial adhesions and the adhesions after aging measured in the case of an aluminium nitride substrate are about 50% weaker than the corresponding values obtained with respect to an alumina substrate.

SUMMARY OF THE INVENTION

An object of the present invention is to provide an atmosphere for producing thick layers on a support having a high thermal dissipation of the aluminium nitride type, which, in the case of inks or pastes based on non-noble metals such as copper, or other compatible materials, ensures a good adherence of the layers, an excellent quality and a reproducibility of the electrical, mechanical and thermal properties of the electronic element, which conditions are essential to the good operation of electronic circuits employing a very dense implantation of components and/or employing power circuits.

According to the invention, the atmosphere of the stage for eliminating polymer resins has an oxygen content of between 100 ppm and 5000 ppm, while the oxygen contents of the sintering atmosphere at high temperature and of the cooling atmosphere must be below about 10 ppm, and preferably the atmosphere of the polymer resin eliminating stage has an oxygen content of between 250 ppm and 3000 ppm.

Therefore, the merit of the present invention is to have discovered, in apparent contradiction to the aforementioned cited works, that, in the course of the firing of thick layers based on a non-noble metal such as copper, on an aluminium nitride support, the presence of oxygen in the inert atmosphere of a furnace, in the region of the polymer resin eliminating stage, improves the physical characteristics of the layers, in particular the adhesion of the layers on the support, up to values comparable to the performances attained in the case of the production of thick copper layers on an alumina substrate. The corresponding performances as to resistivity are good, notwithstanding the high oxygen contents employed.

One manner of carrying out the invention comprises, prior to said production, effecting a preoxidation of the aluminium nitride support under an oxidizing atmosphere, for example unde air or under a mixture of nitrogen, hydrogen and water vapour, at a temperature of between 1200° C. and 1500° C., during a treatment priod on the order of one hour, which improves the adhesion of the layers to the support. The firing of the thick copper layers on these preoxidized aluminium nitride supports is then effected in an inert atmosphere comprising, in the region of the polymer resin eliminating zone, an oxygen content lower than 250 ppm.

DETAILED DESCRIPTION OF THE INVENTION

The invention will now be described in detail with reference to the following examples:

Commercially-available inks based on copper were employed and fired under different atmospheres based on nitrogen after having been serigraphed and dried by proceeding in the way usual in the industry.

The pattern of the chosen tests comprises, among others, a loop for evaluating the resistivity, and studs of different sizes for evaluating the adherence. The studs are square shaped having 1.5 mm or 2 mm sides. This pattern was serigraphed on square substrates of aluminium nitride having 50.8 mm sides. The degree of purity of the aluminium nitride substrates employed is higher than 98%.

The firings under atmospheres were carried out in a conventional industrial passage furnace of the type including a conveyor belt. The complete firing cycle which was chosen lasts 55 minutes with a sintering plateau at 900° C. ($\pm 2°$ C.) lasting about 10 minutes.

After firing, a group of electrical and mechanical tests were carried out comprising measurements of adherence, resistivity, solderability and aptitude for cabling.

As concerns the adherence, a particularly critical factor in the case of thick copper layers, the procedure was the following: copper hooks were soldered with tin-lead-silver (62-36-2) at 215° C. to copper studs, then these hooks were subjected to tensile tests and the rupture forces were measured so as to evaluate the adherence power.

The aging consisted in placing in an oven at 150° C. for 200 hours, hooks soldered to studs before subjecting them to the tensile tests, as previously described.

Test No 1 consisted in a firing under a so-called industrial nitrogen atmosphere, without addition of gaseous doping agents, its oxygen content being 4 ppm and the water vapour content 12 ppm.

Test No 2 consisted in a firing under a nitrogen atmosphere with addition of oxygen in the polymer resin eliminating zone with an oxygen content of 500 ppm, the water vapour content remaining at 12 ppm.

Test No 3 consisted in a firing under a nitrogen atmosphere with addition of oxygen in the polymer resin eliminating zone, with an oxygen content of 400 ppm, the water vapour content remaining at 12 ppm.

| The comparative results: | | | |
| --- | --- | --- | --- |
|  | Test No 1 | Test No 2 | Test No 3 |
| Resistivity of the layer (milliohms/square/ 18 um) | 1.60 ± 0.05 | 1.40 ± 0.05 | 2.00 ± 0.05 |
| Initial adherence (N/sq.mm) | zero | 14 ± 2.5 | 30 ± 4.2 |
| Adherence after aging (N/sq.mm) | zero | 6.2 ± 1.7 | 18.7 ± 1.7 |
| Aptitude for microcabling (in mN, thermosonic cabling with gold wire 30 μm in dia.) | zero | 94 ± 24 | 100 ± 21 |

The thick copper layers obtained within the framework of Test No 1 were very largely non-adhered to the substrate, whence a considerable degradation of the electrical and mechanical properties of the layers and a virtual impossibility to effect the measurements.

The presented results show quite clearly that the addition of oxygen exclusively in the polymer resin eliminating zone of the furnace gives improved physical characteristics with respect to the thick copper layers on an aluminium nitride substrate, in particular as concerns the initial adhesion and the adhesion after aging.

We claim:

1. A process for manufacturing thick-film electrically conductive connection structures on a support having high thermal dissipation properties, which comprises the following successive steps:
   depositing onto said support at least one patterned layer of a paste containing a non-noble conductive metal dispersed in an organic phase to form a layered component;
   drying the deposited paste at a first temperature;
   subjecting said support to a second temperature under a first substantially inert atmosphere having an oxygen content between 100 and 5000 ppm to eliminate substantially the organic phase, said second temperature being lower than 600° C. and higher than said first temperature;
   sintering said deposited layer at a third temperature under a second substantially inert atmosphere having an oxygen content less than 10 ppm, said third temperature being higher than said second temperature;
   cooling said support under a third substantially inert atmosphere, said third substantially inert atmosphere having an oxygen content less than 10 ppm.

2. The process of claim 1 wherein said first atmosphere has an oxygen content between 500 and 4000 ppm.

3. The process of claim 1 wherein said first atmosphere has an oxygen content between 250 and 3000 ppm.

4. The process of claim 1, wherein said second substantially inert atmosphere is the same as said third substantially inert atmosphere.

5. The process of claim 1 wherein said support is made of non-oxidized aluminum nitride.

6. The process of claim 5, wherein said non-noble metal is copper.

7. The process of claim 6, wherein said first, second, and third substantially inert atmospheres comprise nitrogen.

8. A process for manufacturing a thick-film electrically conductive connection structure on a support made of aluminum nitride, which comprises the following successive steps:
   superficially oxidizing the support under an oxidizing atmosphere at a temperature between 1200° C. and 1500° C. for a period of about one hour;
   depositing onto said support at least one patterned layer of a paste containing a non-noble conductive metal dispersed in an organic phase to form a layered component;
   drying the deposited paste at a first temperature;
   subjecting said support to a second temperature under a first substantially inert atmosphere having an oxygen content between 100 and 5000 ppm to eliminate substantially the organic phase, said second temperature being lower than 600° C. and being higher than said first temperature;
   sintering said deposited layer at a third temperature under a second substantially inert atmosphere having an oxygen content less than 10 ppm, said third temperature being higher than said second temperature;
   cooling said treated support under a third substantially inert atmosphere, said third substantially inert atmosphere having an oxygen content less than 10 ppm.

9. The process of claim 8 wherein said first substantially inert atmosphere has an oxygen content not less than 100 ppm.

* * * * *